(12) United States Patent
Yu et al.

(10) Patent No.: US 11,881,539 B2
(45) Date of Patent: *Jan. 23, 2024

(54) STRUCTURE AND METHOD OF ADVANCED LCOS BACK-PLANE HAVING HIGHLY REFLECTIVE PIXEL VIA METALLIZATION

(71) Applicant: Applied Materials, Inc., Santa Clara, CA (US)

(72) Inventors: Lan Yu, Albany, NY (US); Benjamin D. Briggs, Clifton Park, NY (US); Tyler Sherwood, Fonda, NY (US); Raghav Sreenivasan, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 13 days.

This patent is subject to a terminal disclaimer.

(21) Appl. No.: 17/100,402

(22) Filed: Nov. 20, 2020

(65) Prior Publication Data

US 2022/0165912 A1    May 26, 2022

(51) Int. Cl.
    *H01L 33/00*     (2010.01)
    *H01L 33/62*     (2010.01)
    *G02F 1/1362*    (2006.01)

(52) U.S. Cl.
    CPC .... *H01L 33/0095* (2013.01); *G02F 1/136277* (2013.01); *H01L 33/62* (2013.01); *H01L 2933/0066* (2013.01)

(58) Field of Classification Search
    CPC ............... H01L 33/0095; H01L 33/62; H01L 2933/0066; G02F 1/133553; G02F 1/1368; G02F 1/136277; G02F 1/136
    See application file for complete search history.

(56) References Cited

U.S. PATENT DOCUMENTS

| 5,170,407 A | 12/1992 | Schubert et al. |
| 5,892,563 A * | 4/1999 | Ono .................. G02F 1/136277 349/114 |
| 5,903,058 A | 5/1999 | Akram |
| 6,008,876 A | 12/1999 | Moore |

(Continued)

FOREIGN PATENT DOCUMENTS

| CN | 101398579 B | 6/2010 |
| CN | 101866083 B | 5/2012 |

(Continued)

OTHER PUBLICATIONS

International Search Report and Written Opinion dated Mar. 15, 2022 in International Patent Application No. PCT/US2021/059756, 6 pages.

(Continued)

*Primary Examiner* — Victor A Mandala
(74) *Attorney, Agent, or Firm* — Kilpatrick Townsend & Stockton LLP (57) ABSTRACT

Processing methods may be performed to form a pixel material in a semiconductor substrate. The methods may include forming a lithographic mask overlying the semiconductor substrate. The lithographic mask may include a window. The method may include forming a via in the semiconductor substrate by a dry etch process through the window. The method may also include forming the pixel material by depositing a fill material in the via.

13 Claims, 7 Drawing Sheets

(56) References Cited

U.S. PATENT DOCUMENTS

| | | | |
|---|---|---|---|
| 6,333,519 | B1 | 12/2001 | Nakazawa |
| 6,356,332 | B1 | 3/2002 | Ichikawa et al. |
| 6,435,942 | B1 | 8/2002 | Jin et al. |
| 6,577,362 | B1 | 6/2003 | Moore |
| 6,795,144 | B1 | 9/2004 | Okuda et al. |
| 7,928,579 | B2 | 4/2011 | Wark et al. |
| 11,322,910 | B2* | 5/2022 | Park ................. H01S 5/0217 |
| 11,573,452 | B2 | 2/2023 | Yu et al. |
| 11,586,067 | B2 | 2/2023 | Yu et al. |
| 2001/0045999 | A1 | 11/2001 | Nakazawa et al. |
| 2002/0126233 | A1 | 9/2002 | Yamagishi et al. |
| 2002/0175414 | A1 | 11/2002 | Teh et al. |
| 2004/0017537 | A1 | 1/2004 | Magana et al. |
| 2005/0134753 | A1 | 6/2005 | Higuchi et al. |
| 2007/0026557 | A1 | 2/2007 | Yu et al. |
| 2007/0026679 | A1 | 2/2007 | Yu et al. |
| 2007/0170430 | A1 | 7/2007 | Nakagawa |
| 2007/0175104 | A1 | 8/2007 | Nishiyama et al. |
| 2007/0262463 | A1 | 11/2007 | Akram |
| 2007/0284627 | A1 | 12/2007 | Kimura |
| 2007/0287211 | A1 | 12/2007 | Wu |
| 2011/0237009 | A1 | 9/2011 | Huang et al. |
| 2012/0081645 | A1 | 4/2012 | Yoshimura et al. |
| 2013/0027651 | A1 | 1/2013 | Meldrim |
| 2015/0048514 | A1 | 2/2015 | Tang et al. |
| 2016/0111324 | A1 | 4/2016 | Chiu et al. |
| 2017/0075166 | A1* | 3/2017 | Son ................. G02F 1/134336 |
| 2018/0190878 | A1 | 7/2018 | Li et al. |
| 2018/0337090 | A1 | 11/2018 | Shen et al. |
| 2018/0351035 | A1 | 12/2018 | Chung et al. |
| 2019/0164944 | A1* | 5/2019 | Chae ................. H01L 33/62 |
| 2020/0152691 | A1* | 5/2020 | Lee ................. H01L 33/382 |
| 2022/0163707 | A1* | 5/2022 | Yu ................. G02B 5/0808 |
| 2022/0163834 | A1* | 5/2022 | Yu ................. H01L 23/53276 |
| 2022/0163845 | A1* | 5/2022 | Yu ................. G02F 1/133553 |
| 2022/0163846 | A1* | 5/2022 | Yu ................. G02F 1/133553 |
| 2022/0165912 | A1 | 5/2022 | Yu et al. |
| 2022/0223402 | A1* | 7/2022 | Yu ................. H01L 21/47573 |
| 2022/0283452 | A1* | 9/2022 | Nelson ................. H01L 31/11 |
| 2022/0285425 | A1* | 9/2022 | Young ................. H01L 33/44 |

FOREIGN PATENT DOCUMENTS

| | | |
|---|---|---|
| CN | 108845442 A | 11/2018 |
| JP | 2000-124313 A | 4/2000 |
| JP | 2007-193200 A | 8/2007 |
| JP | 2011-123093 A | 6/2011 |
| TW | 200415550 A | 8/2004 |
| TW | 200744127 A | 12/2007 |
| TW | 200834197 A | 8/2008 |
| TW | 200842400 A | 11/2008 |
| TW | 200916406 A | 4/2009 |
| TW | 201001009 A | 1/2010 |
| TW | 201218274 A | 5/2012 |
| TW | 202039719 A | 11/2020 |
| WO | 2020-008765 A1 | 1/2020 |

OTHER PUBLICATIONS

International Search Report and Written Opinion dated Mar. 15, 2022 in International Patent Application No. PCT/US2021/059752, 6 pages.

International Search Report and Written Opinion dated Apr. 29, 2022 in International Patent Application No. PCT/US2022/011847, 7 pages.

International Search Report and Written Opinion dated Mar. 4, 2022 in International Patent Application No. PCT/US2021/059737, 8 pages.

International Search Report and Written Opinion dated Mar. 8, 2022 in International Patent Application No. PCT/US2021/059744, 8 pages.

International Preliminary Report on Patentability dated Jul. 4, 2023, in International Patent Application No. PCT/US2022/011847, 5 pages.

International Preliminary Report on Patentability dated May 16, 2023, in International Patent Application No. PCT/US2021/059744, 5 pages.

International Preliminary Report on Patentability dated May 16, 2023, in International Patent Application No. PCT/US2021/059752, 4 pages.

International Preliminary Report on Patentability dated May 16, 2023, in International Patent Application No. PCT/US2021/059756, 4 pages.

International Preliminary Report on Patentability dated May 16, 2023, in International Patent Application No. PCT/US2021/059737, 5 pages.

* cited by examiner

STRUCTURE AND METHOD OF ADVANCED LCOS BACK-PLANE HAVING HIGHLY REFLECTIVE PIXEL VIA METALLIZATION

CROSS-REFERENCES TO RELATED APPLICATIONS

The present technology is related to the following applications, all concurrently filed Nov. 20, 2020, and titled: "STRUCTURE AND METHOD OF ADVANCED LCOS BACK-PLANE HAVING ROBUST PIXEL VIA METALLIZATION" Application No. 17/100,407), "STRUCTURE AND METHOD OF MIRROR GROUNDING IN LCOS DEVICES" Application No. 17/100,416), "STRUCTURE AND METHOD OF BI-LAYER PIXEL ISOLATION IN ADVANCED LCOS BACK-PLANE" Application No. 17/100,400), and "METHOD FOR LCOS DBR MULTILAYER STACK PROTECTION VIA SACRIFICIAL HARDMASK FOR RIE AND CMP PROCESSES" Application No. 17/100,422). The present technology is also related to "METHOD OF CMP INTEGRATION FOR IMPROVED OPTICAL UNIFORMITY IN ADVANCED LCOS BACK-PLANE" (Application No. 17/149,399), filed Jan. 14, 2021. Each of these applications is hereby incorporated by reference in their entirety for all purposes.

TECHNICAL FIELD

The present technology relates to semiconductor systems, processes, and equipment. More specifically, the present technology relates to processes and systems for forming and etching material layers on a semiconductor substrate.

BACKGROUND

Advanced liquid crystal on silicon (LCoS) devices are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process or individual material removal. Such an etch process is said to be selective to the first material. As a result of the diversity of materials, circuits, and processes, etch processes have been developed with a selectivity towards a variety of materials.

Multilayer LCoS structures, such as those incorporating distributed Bragg reflectors (DBRs), may incorporate layers of dielectric or conducting material formed in a series of fabrication operations. An electrical contact between layers of the LCoS structures may be formed as a high aspect ratio structure, which may limit the selection of materials from which to form the electrical contact to those compatible with high aspect ratio deposition. Compatibility with high aspect ratio deposition may exclude highly reflective materials and may reduce the overall optical performance of the LCoS structures. Furthermore, oxidation or diffusion effects may cause degradation of metal layers or structures in the LCoS structure, including, but not limited to, formation of voids, degradation of electrical conductivity, degradation of electrical contacts at interfaces between metal structures, or degradation of optical performance of reflective metal surfaces. Optical performance being a key design criterion for display devices, such reductions in reflectivity of LCoS structures, in favor of robust materials, pose a significant obstacle for widespread adoption of the technology in display devices.

Thus, there is a need for improved systems and methods that can be used to produce high quality devices and structures. These and other needs are addressed by the present technology.

SUMMARY

Processing methods may be performed to form a pixel material in a semiconductor substrate. The methods may include removing a portion of a pixel material from the semiconductor structure by an etch process selective to the pixel material relative to an uppermost layer of an optical stack of the semiconductor structure. The method may include forming a reflective metal fill layer overlying the pixel material and the optical stack. The method may also include removing a portion of the reflective metal fill layer, revealing an upper surface of the optical stack external to the pixel material.

In some embodiments, the reflective metal fill layer may include aluminum. Removing the portion of the pixel material may include etching the pixel material to a depth of at least 60 nm. Removing the portion of the pixel material may further include etching the pixel material to a depth less than 100 nm. Removing the portion of the reflective metal fill layer may form a reflective cap of the pixel material characterized by an aspect ratio less than 1. Removing the portion of the reflective metal fill layer may also include forming, by chemical mechanical polishing of the reflective metal fill layer, a reflective upper surface of the pixel material being substantially level with the upper surface of the optical stack. Removing the portion of the reflective metal fill layer may form a reflective cap of the pixel material. The method may further include forming a barrier layer overlying the reflective cap of the pixel material and the upper surface of the optical stack.

The present technology also encompasses semiconductor structures including a semiconductor substrate. The structures may include a metal layer overlying the semiconductor substrate. The structures may include a spacer layer overlying the metal layer. The structures may include a mirror layer overlying the spacer layer. The structures may include an optical stack overlying the mirror layer. The structures may include a pixel material extending from the metal layer to the optical stack. The pixel material may be or include a refractory material. The structures may also include a reflective cap overlying the pixel material, the reflective cap having a reflective surface substantially level with an upper surface of the optical stack.

In some embodiments, the reflective cap may be or include aluminum. The reflective cap may be characterized by a thickness, relative to the reflective surface of the reflective cap, of at least 60 nm. The reflective cap may be further characterized by a thickness, relative to the reflective surface of the reflective cap, of less than 100 nm. The reflective cap may be characterized by an aspect ratio less than 1. The semiconductor structure may further include a barrier layer overlying the reflective cap and the optical stack. The barrier layer may be or include silicon carbon nitride. The refractory material may be or include one or more of tungsten, ruthenium, or tantalum nitride.

The present technology also encompasses semiconductor structures including a semiconductor substrate. The structures may include a metal layer overlying the semiconductor substrate. The structures may include a spacer layer overlying the metal layer. The structures may include a mirror layer overlying the spacer layer. The structures may include an optical stack overlying the mirror layer. The structures may include a pixel material extending from the metal layer to the optical stack. The pixel material may be or include a non-refractory metal. The structures may also include a reflective cap overlying the pixel material, the reflective cap having a reflective surface substantially level with an upper surface of the optical stack.

In some embodiments, the metal layer may be or include the non-refractory metal. The non-refractory metal may be or include one or more of copper or cobalt. The structures may further include a barrier layer overlying the reflective cap and the optical stack. The barrier layer may be or include silicon carbon nitride.

Such technology may provide numerous benefits over conventional systems and techniques. For example, embodiments of the present technology may exhibit improved reflectivity of LCoS structures by introducing a reflective cap for a pixel material in a low aspect ratio morphology. These and other embodiments, along with many of their advantages and features, are described in more detail in conjunction with the below description and attached figures.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes systems and components for semiconductor processing of liquid crystal on silicon (LCoS) back-plane devices. Semiconductor structures built with an embedded optical stack, such as a distributed Bragg reflector (DBR), can have dramatically enhanced optical performance for increased display brightness and lower power consumption relative to other reflective back-plane structures for liquid crystal displays. In an LCoS pixel structure, an optical stack, such as an embedded DBR, may be interposed between a metal layer and a liquid crystal layer, where the electrical potential for actuating the liquid crystal layer may be provided by the metal layer. For example, a pixel material may be formed through the DBR to provide an electrical contact between the metal layer and the liquid crystal layer, as, for example, when a transparent conducting film overlies the DBR. The pixel material may be or include a metal or electrically conductive material, the composition of which can be selected to provide a high-aspect ratio electrical contact by filling a narrow via etched into the DBR. The selection of the pixel material, however, may also reduce the optical performance of the DBR, for example, by absorbing light otherwise reflected by the DBR. In some embodiments, as when a lateral dimension of the LCoS pixel structure approaches 5 microns or less, the relative size of the pixel material may significantly influence the optical performance of the LCoS back-plane. In this way, selecting a material for a pixel contact that is compatible with high-aspect ratio deposition, but has reduced reflectance, may reduce the overall optical performance of an LCoS display device.

Furthermore, incorporating the optical stack in the LCoS back-plane can add complexity to fabrication processes, as when incorporating layers of dielectric or conducting material formed in a series of fabrication operations. In some cases, layers or structures may be formed by deposition methods using an oxygen-containing plasma, such as, for example, deposition of conducting oxide films by plasma enhanced chemical vapor deposition. In some cases, layers or structures may be formed by thermal deposition methods whereby elevated temperatures may induce diffusion of materials between layers or structures. For example, deposition of high-k materials overlying metal structures may induce thermal diffusion of metal atoms into the high-k materials. Oxidation or diffusion may cause degradation of metal layers or structures in the LCoS structure, including, but not limited to, formation of voids, oxidation, degradation of electrical conductivity, degradation of electrical contacts at interfaces between metal structures, or degradation of optical performance of reflective metal surfaces.

One approach to overcome limitations introduced by aspect ratio design constraints and degradation of pixel materials is to replace typical contact materials, such as copper or cobalt, with robust refractory materials including, but not limited to, tungsten, ruthenium, or tantalum nitride. Forming a pixel contact from refractory materials provides an electrical contact to the overlying structures, while exhibiting reduced susceptibility to degradation under process conditions described above. Even so, the refractory materials from which robust pixel contacts may be formed exhibit significantly reduced reflectivity, as compared to typical contact materials. For example, aluminum may be used to form reflective mirrors, while tungsten may not provide a similarly reflective surface. As such, the choice of a refractory material for a pixel material may be accompanied by a reduction of optical performance. That being said, aluminum may be incompatible with deposition as a high aspect ratio pixel contact below a threshold pixel size. For example, below a lateral width of 100 nm, aluminum may be incompatible with high aspect ratio deposition.

The present technology overcomes such limitations through an improved pixel material structure and fabrication method, as described below. In some embodiments, the methods include forming a reflective cap on a pixel material to connect an underlying metal layer and an overlying transparent conductive layer, while providing enhanced optical performance to the LCoS structure. The pixel material may be or include a refractory material selected to provide improved robustness of the pixel material during subsequent fabrication operations, such as forming pixel isolation structures. Furthermore, the pixel material may be or include a non-refractory material that is compatible with high aspect ratio deposition to provide an electrical contact with the underlying metal layer. The reflective cap may be or include a material that is compatible with semiconductor manufacturing processes, and amenable to providing a highly reflective surface when polished. In some embodiments, the reflective cap may be or include a material that is not compatible with high-aspect ratio deposition, such that the pixel material may be different from the material making up the reflective cap.

Although the remaining disclosure will routinely identify specific etching processes utilizing the disclosed technology, it will be readily understood that the systems and methods are equally applicable to deposition and cleaning processes as may occur in the described chambers. Accordingly, the technology should not be considered to be so limited as for use with etching processes alone. The disclosure will discuss one possible system and chamber that can be used with the present technology to perform certain of the removal operations before describing operations of an exemplary process sequence according to the present technology.

Figure 1:
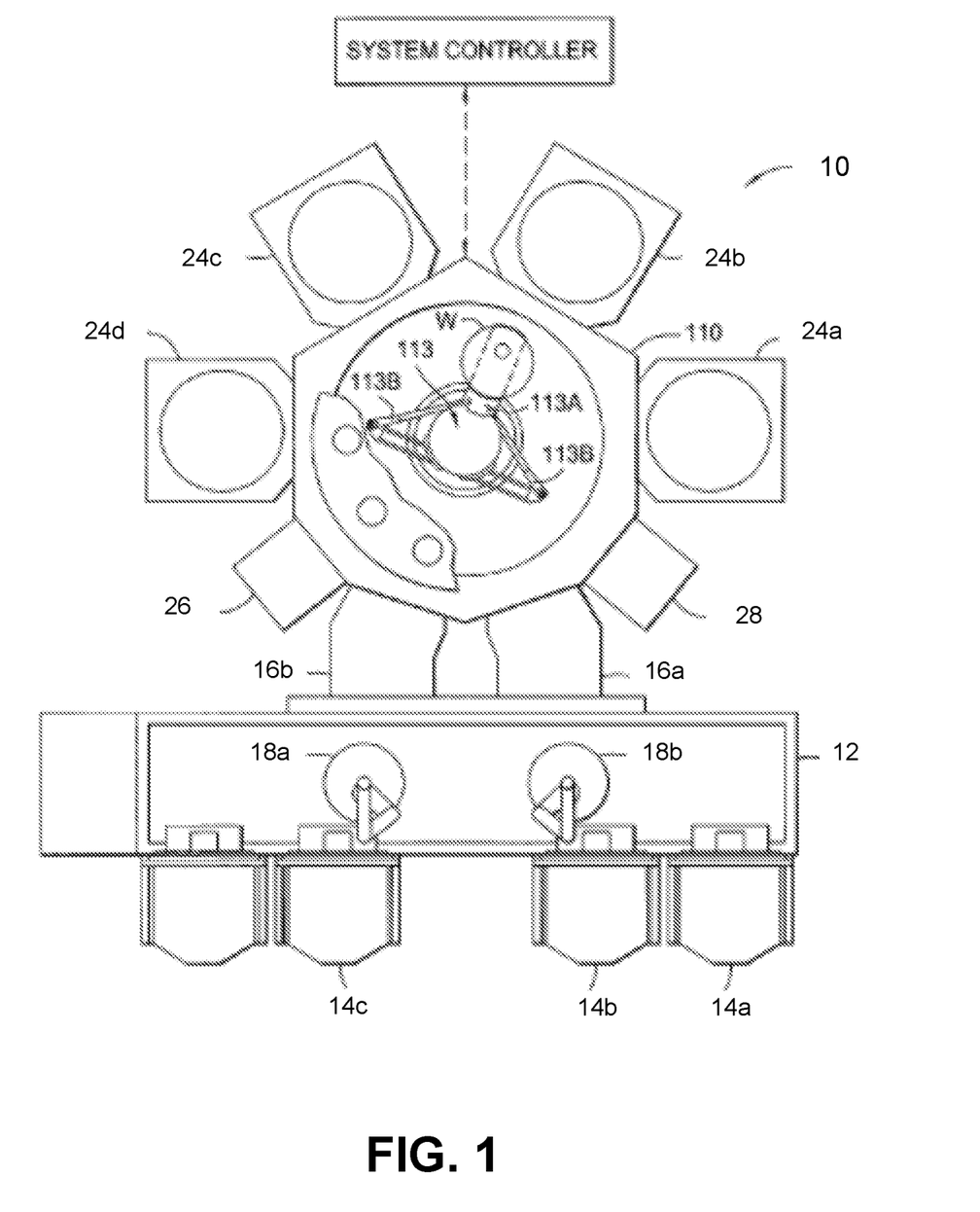
FIG. 1 shows a schematic top plan view of an exemplary processing system according to some embodiments of the present technology.

FIG. 1 shows a top plan view of one embodiment of a processing system 10 of deposition, etching, baking, and/or curing chambers according to embodiments. The tool or processing system 10 depicted in FIG. 1 may contain a plurality of process chambers, 24a-d, a transfer chamber 20, a service chamber 26, an integrated metrology chamber 28, and a pair of load lock chambers 16a-b. The process chambers may include any number of structures or components, as well as any number or combination of processing chambers.

To transport substrates among the chambers, the transfer chamber 20 may contain a robotic transport mechanism 22. The transport mechanism 22 may have a pair of substrate transport blades 22a attached to the distal ends of extendible arms 22b, respectively. The blades 22a may be used for carrying individual substrates to and from the process chambers. In operation, one of the substrate transport blades such as blade 22a of the transport mechanism 22 may retrieve a substrate W from one of the load lock chambers such as chambers 16a-b and carry substrate W to a first stage of processing, for example, a treatment process as described below in chambers 24a-d. The chambers may be included to perform individual or combined operations of the described technology. For example, while one or more chambers may be configured to perform a deposition or etching operation, one or more other chambers may be configured to perform a pre-treatment operation and/or one or more post-treatment operations described. Any number of configurations are encompassed by the present technology, which may also perform any number of additional fabrication operations typically performed in semiconductor processing.

If the chamber is occupied, the robot may wait until the processing is complete and then remove the processed substrate from the chamber with one blade 22a and may insert a new substrate with a second blade. Once the substrate is processed, it may then be moved to a second stage of processing. For each move, the transport mechanism 22 generally may have one blade carrying a substrate and one blade empty to execute a substrate exchange. The transport mechanism 22 may wait at each chamber until an exchange can be accomplished.

Once processing is complete within the process chambers, the transport mechanism 22 may move the substrate W from the last process chamber and transport the substrate W to a cassette within the load lock chambers 16a-b. From the load lock chambers 16a-b, the substrate may move into a factory interface 12. The factory interface 12 generally may operate to transfer substrates between pod loaders 14a-d in an atmospheric pressure clean environment and the load lock chambers 16a-b. The clean environment in factory interface 12 may be generally provided through air filtration processes, such as HEPA filtration, for example. Factory interface 12 may also include a substrate orienter/aligner that may be used to properly align the substrates prior to processing. At least one substrate robot, such as robots 18a-b, may be positioned in factory interface 12 to transport substrates between various positions/locations within factory interface 12 and to other locations in communication therewith. Robots 18a-b may be configured to travel along a track system within factory interface 12 from a first end to a second end of the factory interface 12.

The processing system 10 may further include an integrated metrology chamber 28 to provide control signals, which may provide adaptive control over any of the processes being performed in the processing chambers. The integrated metrology chamber 28 may include any of a variety of metrological devices to measure various film properties, such as thickness, roughness, composition, and the metrology devices may further be capable of characterizing grating parameters such as critical dimensions, sidewall angle, and feature height under vacuum in an automated manner.

Each of processing chambers 24a-d may be configured to perform one or more process steps in the fabrication of a semiconductor structure, and any number of processing chambers and combinations of processing chambers may be used on multi-chamber processing system 10. For example, any of the processing chambers may be configured to perform a number of substrate processing operations including any number of deposition processes including cyclical layer deposition, atomic layer deposition, chemical vapor deposition, physical vapor deposition, as well as other operations including etch, pre-clean, pre-treatment, post-treatment, anneal, plasma processing, degas, orientation, and other substrate processes. Some specific processes that may be performed in any of the chambers or in any combination of chambers may be metal deposition, surface cleaning and preparation, thermal annealing such as rapid thermal processing, and plasma processing. Any other processes may similarly be performed in specific chambers incorporated into multi-chamber processing system 10, including any process described below, as would be readily appreciated by the skilled artisan.

Figure 2:
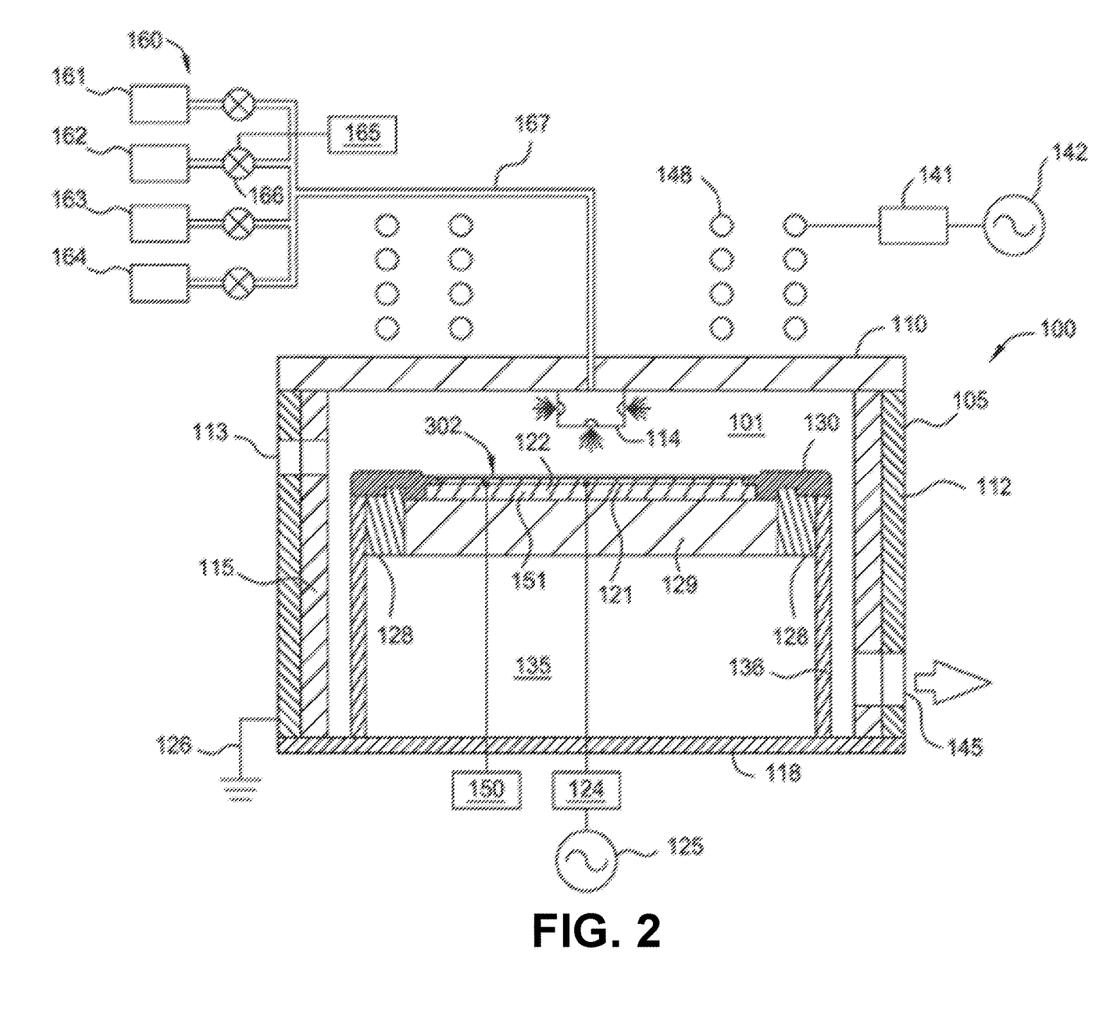
FIG. 2 shows a schematic cross-sectional view of an exemplary processing system according to some embodiments of the present technology.

FIG. 2 illustrates a schematic cross-sectional view of an exemplary processing chamber 100 suitable for patterning a material layer disposed on a substrate 302 in the processing chamber 100. The exemplary processing chamber 100 is suitable for performing a patterning process, although it is to be understood that aspects of the present technology may be performed in any number of chambers, and substrate supports according to the present technology may be included in etching chambers, deposition chambers, treatment chambers, or any other processing chamber. The plasma processing chamber 100 may include a chamber body 105 defining a chamber volume 101 in which a substrate may be processed. The chamber body 105 may have sidewalls 112 and a bottom 118 which are coupled with ground 126. The sidewalls 112 may have a liner 115 to protect the sidewalls 112 and extend the time between maintenance cycles of the plasma processing chamber 100. The dimensions of the chamber body 105 and related components of the plasma processing chamber 100 are not limited and generally may be proportionally larger than the size of the substrate 302 to be processed therein. Examples of substrate sizes include 200 mm diameter, 250 mm diameter, 300 mm diameter and 450 mm diameter, among others, such as display or solar cell substrates as well.

The chamber body 105 may support a chamber lid assembly 110 to enclose the chamber volume 101. The chamber body 105 may be fabricated from aluminum or other suitable materials. A substrate access port 113 may be formed through the sidewall 112 of the chamber body 105, facilitating the transfer of the substrate 302 into and out of the plasma processing chamber 100. The access port 113 may be coupled with a transfer chamber and/or other chambers of a substrate processing system as previously described. A pumping port 145 may be formed through the sidewall 112 of the chamber body 105 and connected to the chamber volume 101. A pumping device may be coupled through the pumping port 145 to the chamber volume 101 to evacuate and control the pressure within the processing volume. The pumping device may include one or more pumps and throttle valves.

A gas panel 160 may be coupled by a gas line 167 with the chamber body 105 to supply process gases into the chamber volume 101. The gas panel 160 may include one or more process gas sources 161, 162, 163, 164 and may additionally include inert gases, non-reactive gases, and reactive gases, as may be utilized for any number of processes. Examples of process gases that may be provided by the gas panel 160 include, but are not limited to, hydrocarbon containing gas including methane, sulfur hexafluoride, silicon chloride, tetrafluoromethane, hydrogen bromide, hydrocarbon containing gas, argon gas, chlorine, nitrogen, helium, or oxygen gas, as well as any number of additional materials. Additionally, process gasses may include nitrogen, chlorine, fluorine, oxygen, and hydrogen containing gases such as $BCl_3$, $C_2F_4$, $C_4F_8$, $C_4F_6$, $CHF_3$, $CH_2F_2$, $CH_3F$, $NF_3$, $NH_3$, $CO_2$, $SO_2$, $CO$, $N_2$, $NO_2$, $N_2O$, and $H_2$, among any number of additional precursors.

Valves 166 may control the flow of the process gases from the sources 161, 162, 163, 164 from the gas panel 160 and may be managed by a controller 165. The flow of the gases supplied to the chamber body 105 from the gas panel 160 may include combinations of the gases form one or more sources. The lid assembly 110 may include a nozzle 114. The nozzle 114 may be one or more ports for introducing the process gases from the sources 161, 162, 164, 163 of the gas panel 160 into the chamber volume 101. After the process gases are introduced into the plasma processing chamber 100, the gases may be energized to form plasma. An antenna 148, such as one or more inductor coils, may be provided adjacent to the plasma processing chamber 100. An antenna power supply 142 may power the antenna 148 through a match circuit 141 to inductively couple energy, such as RF energy, to the process gas to maintain a plasma formed from the process gas in the chamber volume 101 of the plasma processing chamber 100. Alternatively, or in addition to the antenna power supply 142, process electrodes below the substrate 302 and/or above the substrate 302 may be used to capacitively couple RF power to the process gases to maintain the plasma within the chamber volume 101. The operation of the power supply 142 may be controlled by a controller, such as controller 165, that also controls the operation of other components in the plasma processing chamber 100.

A substrate support pedestal 135 may be disposed in the chamber volume 101 to support the substrate 302 during processing. The substrate support pedestal 135 may include an electrostatic chuck 122 for holding the substrate 302 during processing. The electrostatic chuck ("ESC") 122 may use the electrostatic attraction to hold the substrate 302 to the substrate support pedestal 135. The ESC 122 may be powered by an RF power supply 125 integrated with a match circuit 124. The ESC 122 may include an electrode 121 embedded within a dielectric body. The electrode 121 may be coupled with the RF power supply 125 and may provide a bias which attracts plasma ions, formed by the process gases in the chamber volume 101, to the ESC 122 and substrate 302 seated on the pedestal. The RF power supply 125 may cycle on and off, or pulse, during processing of the substrate 302. The ESC 122 may have an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the plasma processing chamber 100.

Electrode 121 may be coupled with a power source 150. The power source 150 may provide a chucking voltage of about 200 volts to about 2000 volts to the electrode 121. The power source 150 may also include a system controller for controlling the operation of the electrode 121 by directing a DC current to the electrode 121 for chucking and de-chucking the substrate 302. The ESC 122 may include heaters disposed within the pedestal and connected to a power source for heating the substrate, while a cooling base 129 supporting the ESC 122 may include conduits for circulating a heat transfer fluid to maintain a temperature of the ESC 122 and substrate 302 disposed thereon. The ESC 122 may be configured to perform in the temperature range required by the thermal budget of the device being fabricated on the substrate 302. For example, the ESC 122 may be configured to maintain the substrate 302 at a temperature of about −150° C. or lower to about 500° C. or higher depending on the process being performed.

The cooling base 129 may be provided to assist in controlling the temperature of the substrate 302. To mitigate process drift and time, the temperature of the substrate 302 may be maintained substantially constant by the cooling base 129 throughout the time the substrate 302 is in the cleaning chamber. In some embodiments, the temperature of the substrate 302 may be maintained throughout subsequent cleaning processes at temperatures between about −150° C. and about 500° C., although any temperatures may be utilized. A cover ring 130 may be disposed on the ESC 122 and along the periphery of the substrate support pedestal 135. The cover ring 130 may be configured to confine etching gases to a desired portion of the exposed top surface of the substrate 302, while shielding the top surface of the substrate support pedestal 135 from the plasma environment inside the plasma processing chamber 100. Lift pins may be selectively translated through the substrate support pedestal 135 to lift the substrate 302 above the substrate support pedestal 135 to facilitate access to the substrate 302 by a transfer robot or other suitable transfer mechanism as previously described.

The controller 165 may be utilized to control the process sequence, regulating the gas flows from the gas panel 160 into the plasma processing chamber 100, and other process parameters. Software routines, when executed by the CPU, transform the CPU into a specific purpose computer such as a controller, which may control the plasma processing chamber 100 such that the processes are performed in accordance with the present disclosure. The software routines may also be stored and/or executed by a second controller that may be associated with the plasma processing chamber 100.

Figure 3:
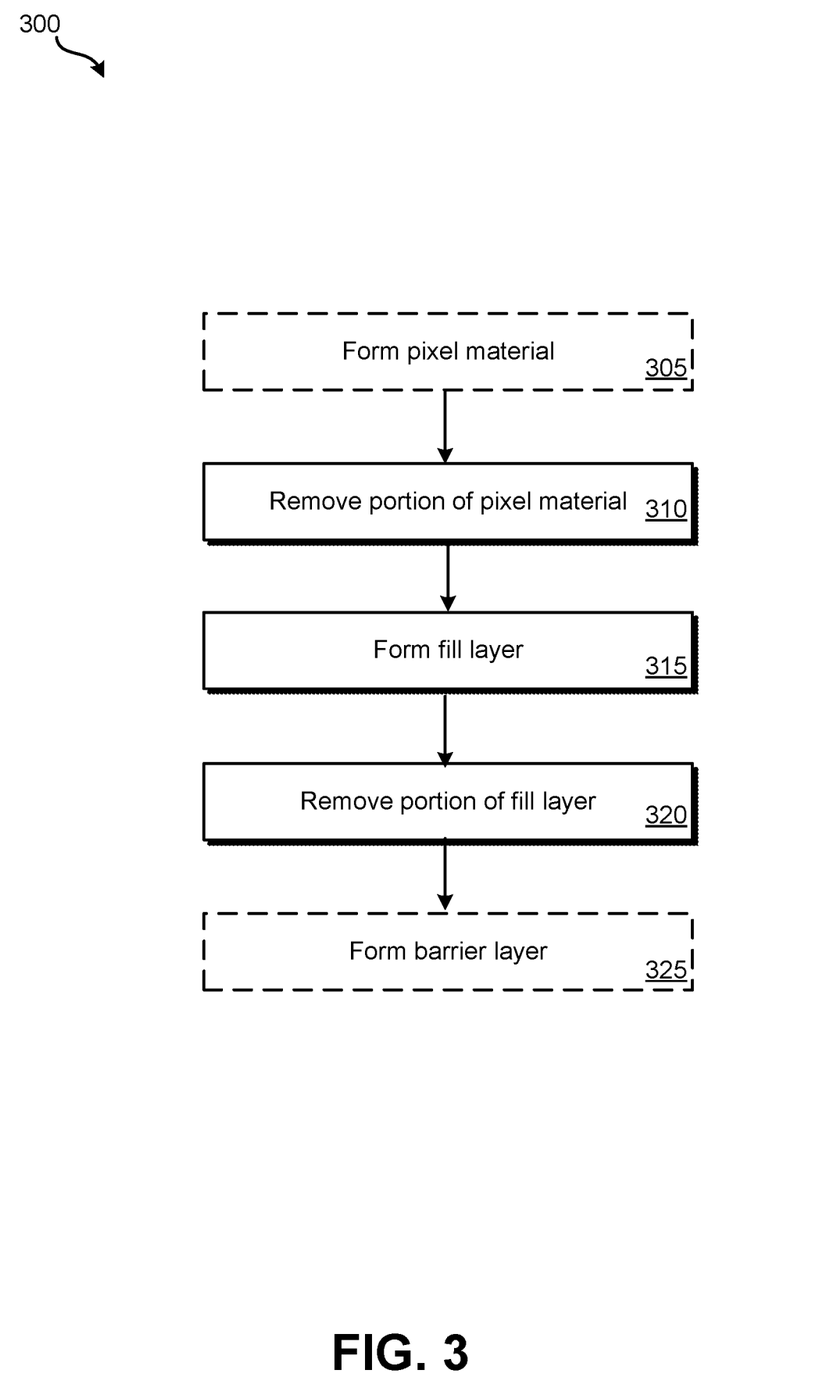
FIG. 3 shows selected operations in a method of forming a pixel material on a semiconductor substrate according to some embodiments of the present technology.

FIG. 3 shows selected operations in a method 300 of forming a pixel material on a semiconductor substrate according to some embodiments of the present technology. Many operations of method 300 may be performed, for example, in the chamber 100 as previously described. Method 300 may include one or more operations prior to the initiation of the method, including front end processing, deposition, etching, polishing, cleaning, or any other operations that may be performed prior to the described operations. The method may include optional operations as denoted in the figure, which may or may not be specifically associated with some embodiments of methods according to the present technology. For example, many of the operations are described in order to provide a broader scope of the structural formation, but are not critical to the technology, or may be performed by alternative methodology as will be discussed further below. Method 300 describes operations shown schematically in FIGS. 4A-4G, the illustrations of which will be described in conjunction with the operations of method 300. It is to be understood that FIG. 4 illustrates only partial schematic views, and a substrate may contain any number of semiconductor sections having aspects as illustrated in the figures, as well as alternative structural aspects that may still benefit from aspects of the present technology. Method 300 may involve optional operations to develop the semiconductor structures to a particular fabrication operation.

Figure 4A:
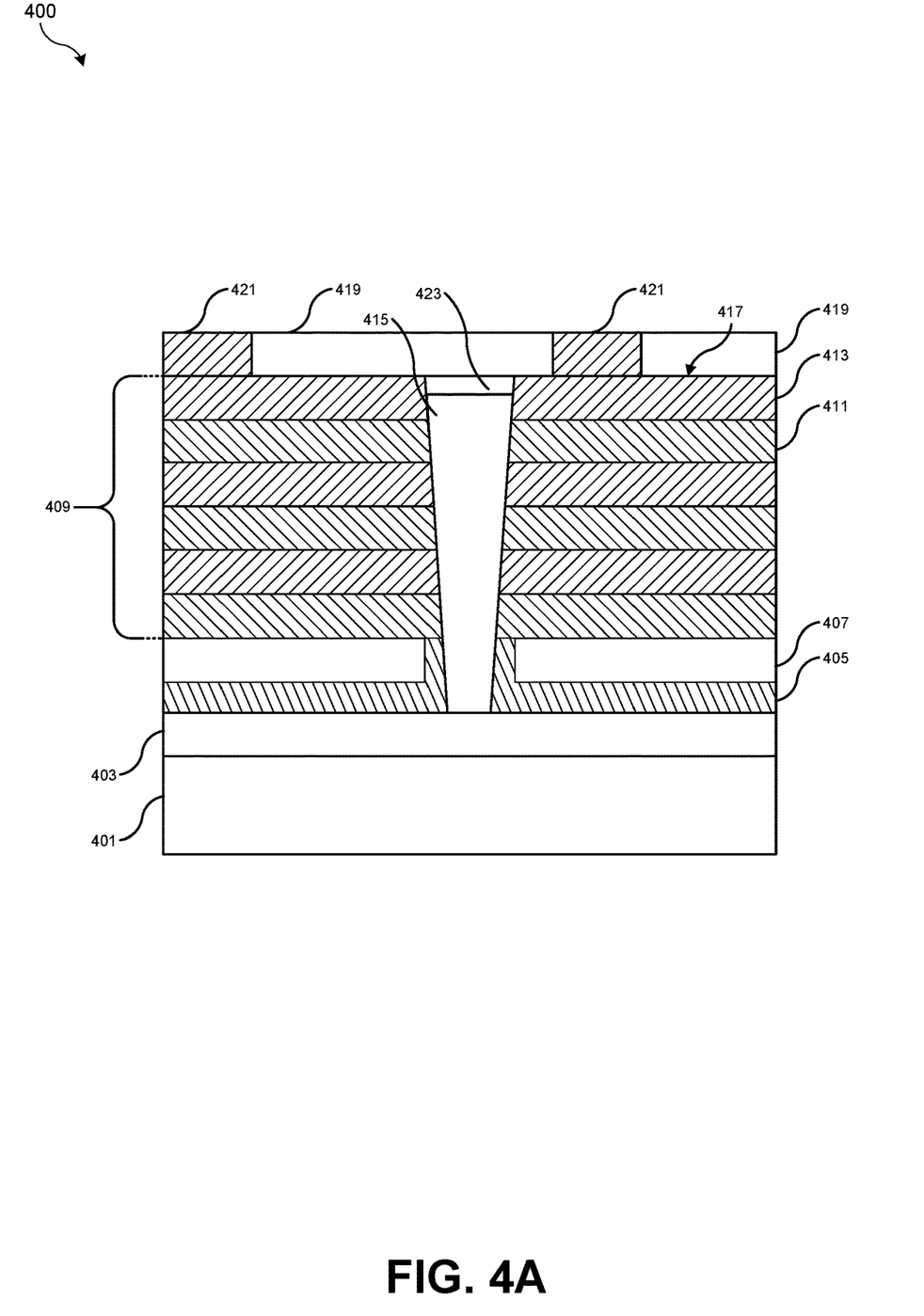
FIGS. 4A-4G illustrate schematic cross-sectional views of substrate materials on which selected operations are being performed according to some embodiments of the present technology.

In the context of method 300, the semiconductor structure 400 may define an active pixel, where the active pixel is described in reference to FIG. 4A. At one or more points in the formation processes leading to the semiconductor structure 400, the operations of method 300 may be implemented to form a conductive contact between constituent layers of the semiconductor structure 400, as described in reference to FIGS. 4B-4G. A resulting display device, formed by a process including the operations of method 300, may incorporate a semiconductor structure 400 having a reflective metallized pixel, and may therefore exhibit a highly reflective pixel material, as well as reduced degradation during one or more fabrication processes subsequent the operations of method 300.

As illustrated in FIG. 4A, the semiconductor structure 400 may represent a liquid crystal on silicon (LCoS) back-plane comprising one or more constituent structures forming an active pixel. As illustrated, structure 400 may include a substrate 401 made of or containing silicon or some other semiconductor substrate material, on which the one or more structures of the LCoS back-plane may be formed. For example, structure 400 may include a metal layer 403, formed, for example, from copper or another metal compatible with semiconductor processing techniques. Structure 400 may further include a reflective and mirror layer 407 that may be or include aluminum, copper, or another reflective material suitable for providing a mirror surface. To electrically insulate the mirror layer 407 from the metal layer 403, a spacer material 405 may be formed overlying the metal layer 403 prior to forming the mirror layer 407. The structure may include an optical stack providing a reflective backing structure. As illustrated, the optical stack can be or include a distributed Bragg reflector 409 (DBR), which may be formed overlying the mirror layer 407. In some embodiments, the optical stack may include other reflective layers or structures, including, but not limited to dielectric mirrors or other high-reflection coatings, In some embodiments, the DBR 409 may include multiple alternating layers of high-k and low-k dielectric materials. For example, low-k layers 411 may be or include a low-k dielectric material, such as silicon oxide or organosilicate glass. By contrast, high-k layers 413 may be or include a high-k dielectric material, such as tantalum oxide. In some embodiments, an uppermost layer of the DBR 409 may be or include the high-k material, as when a first layer overlying the mirror layer 407 is a low-k layer 411.

For further implementation in LCoS devices, the semiconductor structure may include a pixel material 415. As illustrated, the pixel material 415 may extend from an upper surface 417 of the DBR 409 and contact the metal layer 403, which may provide a conductive path between the metal layer 403 and the upper surface 417, through an aperture in the mirror layer 407 and the DBR 409. As described in more detail in reference to the forthcoming figures, the pixel material 415 may be or include a metal or a refractory material selected for suitability both with high aspect ratio deposition and with downstream processing operations such as high-temperature deposition and reactive ion etching.

In some embodiments, the mirror layer 407 may be physically separated from active electrical components of the structure 400 to prevent a short-circuit from affecting multiple pixels, as when the mirror layer 407 spans multiple pixels on the LCoS device. For example, in structure 400, the mirror layer 407 may be electrically isolated from the metal layer 403 and the pixel material 415. By contrast, the pixel material 415 may be in electrical contact with an overlying transparent conductive layer 419 formed on regions of the upper surface 417. In some embodiments, the transparent conductive layer 419 may be or include a transparent conductive oxide, such as indium tin oxide (ITO) or aluminum doped zinc oxide, or a transparent conductive coating incorporating carbon allotropes including, but not limited to, graphene, diamond like carbon, or carbon nanotubes. The transparent conductive layer 419 may provide transparency over one or more wavelength ranges and a conductive contact to energize and actuate a liquid crystal layer overlying the structure 400.

Forming the transparent conductive layer 419 may include plasma deposition techniques. For example, in the case of ITO, forming the transparent conductive layer 419 may include, but is not limited to, plasma enhanced chemical vapor deposition, chemical vapor deposition, spray pyrolysis, reactive e-beam evaporation, sputtering, or physical vapor deposition. Deposition of the transparent conductive layer 419 is conducted in an oxidative environment, at elevated temperatures, or both. In some embodiments, forming the transparent conductive layer 419 may include baking operations, for example, in cases of conductive films formed by spin-coating. During the course of such operations, the pixel material 415 may be exposed to reactive environments, oxidizing environments, or elevated temperatures, which may induce degradation and may negatively impact the electrical contact formed between the metal layer 403 and the transparent conductive layer 419.

In some embodiments, pixels may be defined by pixel isolation structures 421 formed on the upper surface 417, such that an individual pixel may include a pixel material 415 and a transparent conductive layer 419, between two pixel isolation structures 421. In some embodiments, the LCoS backplane may include multiple pixels having the structure 400, from which a display system may be formed having an array of addressable pixels. The pixel isolation structures 421 may be or include a high-k material, such as the material forming the high-k layer 413. In some embodiments, deposition of the pixel isolation structures 421 may be conducted at elevated temperatures at which the material of the pixel material 415 may diffuse into the DBR 409 or the pixel isolation structures 421. For example, when the pixel material 415 is formed of a non-refractory material selected for high reflectance or electrical conductivity, the pixel material 415 may be susceptible to degradation during formation of the pixel isolation structures 421.

In some embodiments, a reflective cap may be interposed between the transparent conductive layer 419 and the pixel material 415. The reflective cap 423 may be formed from a material selected for high reflectivity, but may be incompatible with high aspect ratio deposition. For example, the reflective cap 423 may be or include aluminum, and may be formed by processes similar to those employed for the formation of the mirror layer 407, as when the mirror layer 407 is or includes aluminum. As such, the reflective cap 423 may be characterized by an aspect ratio less than one, where the aspect ratio is a ratio of the thickness of the reflective cap 423 to the lateral width of the reflective cap 423. For example, the aspect ratio of the reflective cap 423 may be less than or about 0.1, less than or about 0.2, less than or about 0.3, less than or about 0.4, less than or about 0.5, less than or about 0.6, less than or about 0.7, less than or about 0.8, less than or about 0.9, or interpolations thereof between zero and one. In some embodiments, the reflective cap 423 may exhibit enhanced reflective properties beyond a threshold thickness, such as greater than or about 10 nm, such as greater than or about 20 nm, greater than or about 30 nm, greater than or about 40 nm, greater than or about 50 nm, greater than or about 60 nm, greater than or about 70 nm, greater than or about 80 nm, greater than or about 90 nm, greater than or about 100 nm, or greater. In some embodiments, forming the reflective cap 423 with a thickness below the threshold thickness may reduce the reflectance of the material. As such, the thickness of the reflective cap 423 may be coupled to the lateral width of the pixel material 415, and the optimum aspect ratio of the reflective cap 423 may approach a minimum corresponding to the threshold thickness of the material from which the reflective cap 423 is formed. In some embodiments, as when the reflective cap 423 is or includes aluminum, the reflective cap 423 may exhibit optimum reflectance properties above a thickness of 60 nm.

As an illustrative example, the pixel material 415 may have a lateral width of 100 nm at the upper surface 417 of the DBR, for which the reflective cap may have a thickness less than 100 nm and greater than the threshold thickness, for example, of 60 nm. In some cases, the reflective cap 423 may be susceptible to degradation under the conditions employed to form the transparent conductive layer 419 or the pixel isolation structures 421. For this reason, one or more sacrificial barrier structures may be formed to protect the reflective cap 423 during fabrication that may be removed as part of forming the structure 400, as described below.

Figure 4B:
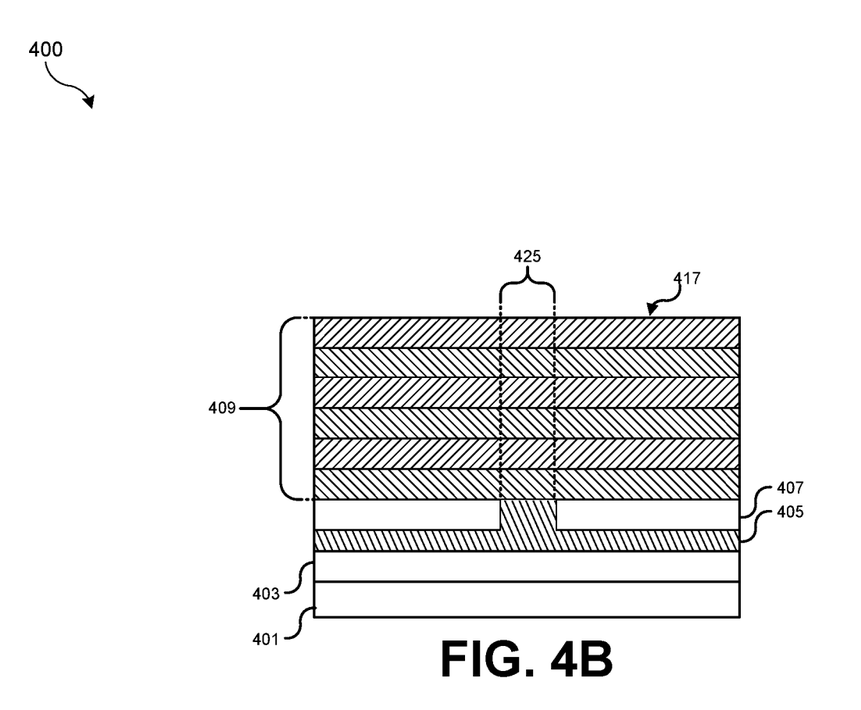
Figure 4C:
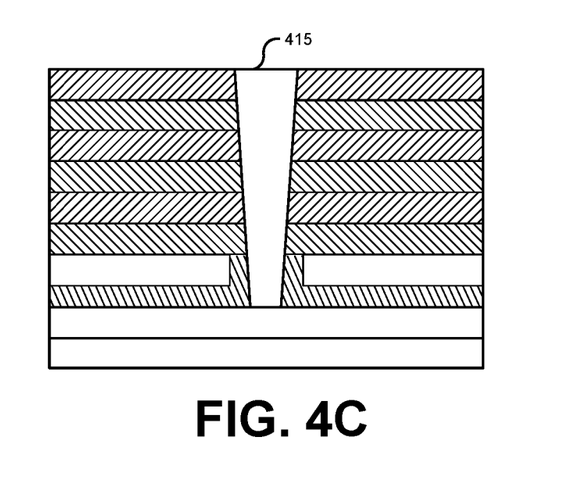

In some embodiments, the method 300 may include optional operations. For example, at operation 305, the pixel material 415 may be formed through a window 425 in the mirror layer 407, as illustrated in FIG. 4B-C. In some embodiments, forming the pixel material 415 may include one or more lithographic and spatially selective etch processes, such as forming a lithographic mask on the upper surface 417 of the DBR 409. The lithographic mask can be or include a softmask, a hard mask, or may be formed from a material selected to shield the upper surface 417 of the DBR 409 from subsequent etch processes. Forming the pixel material 415 may further include forming a high aspect ratio via by a dry etch process to selectively remove portions of the DBR 409, the mirror layer 407, and the spacer material 405, and to reveal the metal layer 403. The via may taper toward the metal layer 403. The taper may facilitate subsequent fill operations and may facilitate forming an electrical connection between the pixel material 415 and the metal layer 403 as part of operation 305. As illustrated in FIG. 4C, at the mirror layer 407, the pixel material 415 may be laterally narrower than the width of the window 425, such that the pixel material 415 may include one or more sloped sidewalls extending from the upper surface 417 of the DBR 409 to the metal layer 403, without intersecting the mirror layer 407. Forming the pixel material 415 may also include depositing a fill material in the via by one or more processes including, but not limited to, chemical vapor deposition, atomic layer deposition, physical vapor deposition, or other techniques compatible with semiconductor fabrication. Similarly, operation 315 may include one or more additional processes, such as removal of excess material to reveal the upper surface 417 of the DBR 409. For example, chemical mechanical polishing may be employed to remove material deposited to form the pixel material 415 during operation 315. In some embodiments, alternative selective removal techniques may be employed, such as wet etching or dry etching, ion milling, or e-beam techniques to selectively remove the material deposited overlying the upper surface 417 of the DBR 409.

As described above, the pixel material 415 may be limited by compatibility with deposition in high aspect ratio morphologies. For example, while some materials may provide superior reflective properties, which would make such materials better suited to act as mirrors or reflective surfaces, the same materials may be unsuitable for forming the pixel material 415 below a threshold feature size of the via. In some embodiments, such limitations may be a result of physical effects including, but not limited to, surface tension or interactions with exposed surfaces of the layers of the DBR 409. For example, at a given lateral width of the via formed in the optical stack, some materials may bridge a mouth of the via, and thus may not fill the via, leaving voids in the pixel material 415 that may negatively impact the quality of the electrical contact between the metal layer 403 and the overlying transparent conductive layer 419 in the structure 400. In some embodiments, such physical phenomena may increase in importance with decreasing lateral width of the via. In this way, selection of the pixel material 415 may be limited to those materials that are suitable to high aspect ratio deposition at small feature sizes, for example, aluminum may be limited to below or about 1:1 aspect ratio features, and copper may be limited to below or about 4:1 aspect ratio features. In some cases, however, aspect ratios as high as about 5:1, as high as about 6:1, as high as about 7:1, as high as about 8:1, as high as about 9:1, or higher, may be formed as an approach to increasing a reflective surface area of the structure 400. To that end, refractory materials including, but not limited to, tungsten, or other materials, such as cobalt, may be deposited in higher aspect ratio features, relative to aluminum or copper.

Furthermore, in some embodiments, the pixel material 415 may be or include a material selected for stability under semiconductor fabrication processes including, but not limited to, thermal deposition, plasma-deposition, oxygen etch, or those producing other reactive environments that may induce oxidation, thermal diffusion or other degradation in non-refractory metals. In some embodiments, the pixel material 415 can be or include tungsten, ruthenium, or tantalum nitride. As described in reference to FIG. 4A, the pixel material 415 may be formed prior to deposition of overlying layers or structures including, but not limited to, the transparent conductive layer 419 or the pixel isolation structures 421. The overlying layers or structures may be formed under elevated temperatures or in reactive or oxidizing environments, where a non-refractory material may be susceptible to degradation. As such, the pixel material 415 may incorporate a refractory material, such as those selected to resist oxidation, or those exhibiting a reduced diffusivity at process temperatures relative to non-refractory materials such as copper or cobalt.

The pixel material 415 may form an electrical contact with the metal layer 403. In some embodiments, non-refractory materials, such as copper, cobalt, or aluminum, may present beneficial properties for inclusion as materials from which to construct the pixel material 415. For example, non-refractory materials may exhibit relatively high reflectance and electrical conductivity, which may facilitate the electrical connection between the metal layer 403 to the transparent conductive layer 419 without significantly impacting the optical performance of the overall structure 400. The susceptibility of non-refractory materials to degradation during subsequent fabrication processes, as described above, may be reduced by depositing a temporary protective layer, such as a diffusion barrier layer, that may be selectively removed as part of forming the overlying structures, such as the pixel isolation structures 421.

Figure 4D:
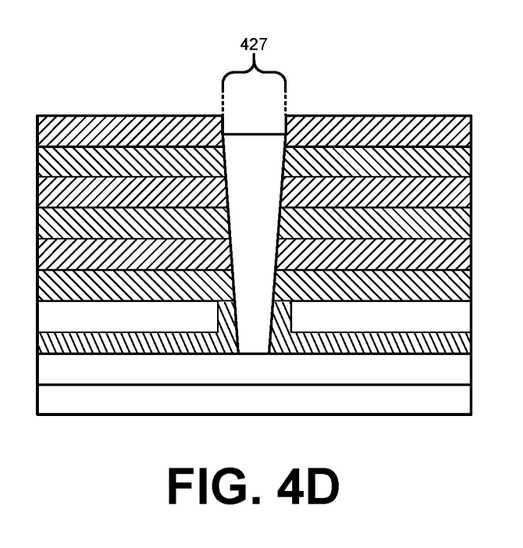

Subsequent formation of the pixel material 415 at operation 305, the method 300 may include operation 310. As illustrated in FIG. 4D, operation 310 may include removing a portion of the pixel material 415. Operation 310 may include an etch process to selectively remove the pixel material 415, while leaving the material of the optical stack negligibly affected. For example, the etch process may be a wet etch process to selectively remove metals, such as an acid etch, to remove a portion of the pixel material 415 to a controlled depth below the upper surface 417 of the DBR 409. In some embodiments, the etch process may be a dry etch process selective to the pixel material 415 relative to the material of the optical stack, such as an oxygen containing plasma, which may selectively remove a portion of the pixel material 415 to the controlled depth below the upper surface 417 of the DBR 409. In this way, a recess 427 may be formed in the pixel material 415. The dimensions of the recess 427 may correspond to an aspect ratio of the reflective cap 423, as described above, such that the reflective cap material may be selected inclusive of materials for which the aspect ratio may limit deposition quality. In some embodiments, the recess 427 may be formed such that the depth of the recess 427 is equal to or less than the lateral width of the pixel material 415 at the upper surface 417 of the optical stack. For example, for a pixel material 415 having a lateral width greater than 100 nm, the recess 427 may extend greater than or about 10 nm, and may extend greater than or about 20 nm, greater than or about 30 nm, greater than or about 40 nm, greater than or about 50 nm, greater than or about 60 nm, greater than or about 70 nm, greater than or about 80 nm, greater than or about 90 nm, greater than or about 100 nm, or more, into the pixel material 415. In some embodiments, a material selected for the reflective cap 423 may be characterized by thickness-dependent reflectance including a threshold thickness under which reflectance drops significantly. In some cases, operation 810 may include removing a portion of the pixel material 415 to exceed the threshold thickness of the selected material. In some embodiments, for example, aluminum films may exhibit superior reflectance for a film thickness exceeding 60 nm. As such, the pixel material 415 may be removed to a depth of 60 nm or more below the upper surface 417 of the DBR 409.

Figure 4E:
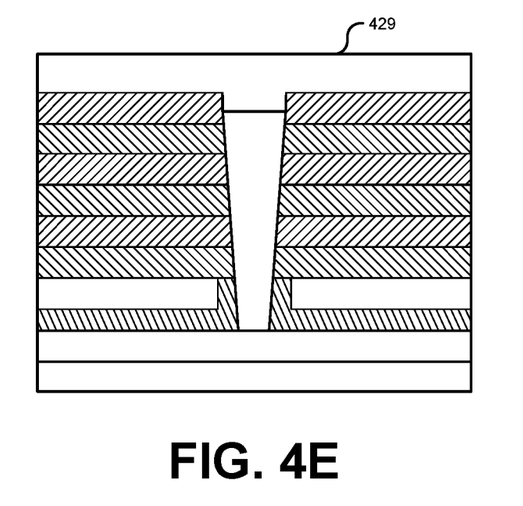

Subsequent operation 310, the method 300 may include operation 315, whereby a fill layer 429 may be formed overlying the upper surface 417 of the DBR 409 and the pixel material 415, as illustrated in FIG. 4E. The fill layer 429 may be or include a metal, such as a non-refractory metal, exhibiting high reflectance when polished. For example, the fill layer 429 may be or include aluminum, copper, or other metals that are compatible with deposition as part of semiconductor fabrication processes. In some embodiments, the fill layer 429 may be formed to an excess thickness, filling the recess 427. Deposition techniques may include one or more metal film formation processes such as physical vapor deposition, sputtering, e-beam deposition, molecular beam epitaxy, ALD, or other thin film deposition approaches.

Figure 4F:
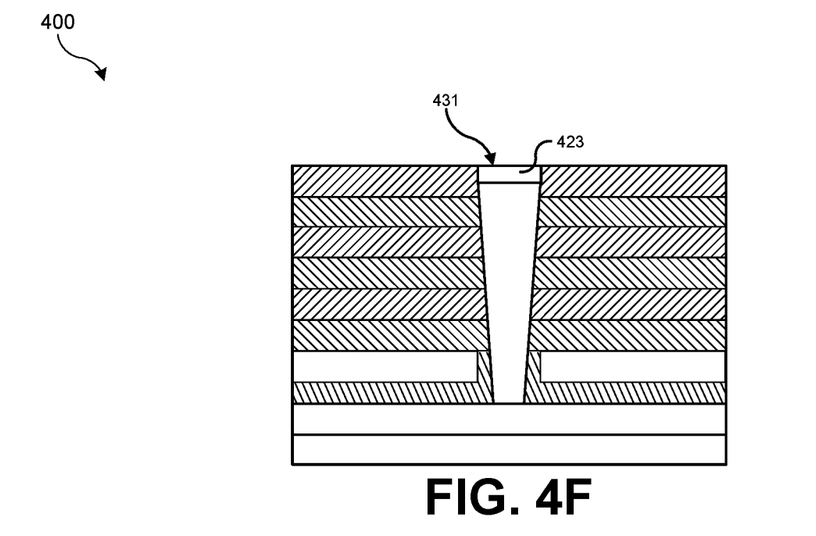

Subsequent operation 315, the method 300 may include operation 320, whereby a portion of the fill layer 429 may be removed to form the reflective cap 423, as illustrated in FIG. 4F. Removing the portion of the fill layer 429 may include one or more selective or depth-controlled removal processes including, but not limited to, chemical mechanical polishing, or wet or dry etching selective to the fill layer 429 relative to the optical stack, such as the high-k layer 413. In some embodiments, operation 320 may include removing material of the fill layer 429 external the reflective cap 423, such that the upper surface 417 of the DBR 409 is revealed. In some embodiments, operation 320 may include providing a reflective surface 431 of the reflective cap 423 that is substantially level with the upper surface 417 of the DBR 409. In this way, the reflective cap 423 may provide an substantially or essentially level surface over which to form the subsequent structures, including sacrificial barrier layers, described below. In some cases, the removal processes of operation 320 may result in the reflective surface 431 having superior reflectance in comparison to the underlying pixel material 415. For example, a mirror polished aluminum layer may have a higher reflectance than a refractory material making up the pixel material 415.

Figure 4G:
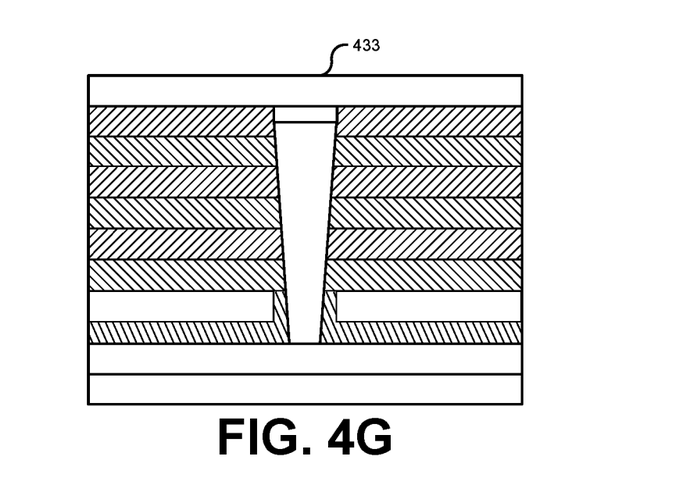

In some embodiments, the method 300 may include additional optional operations. For example, the method 300 may include operation 325, as illustrated in FIG. 4G. In some embodiments, operation 325 may include forming a barrier layer 433 overlying the reflective cap 423 and the upper surface 417 of the DBR 409. The barrier layer 433 may be or include one or more materials selected to protect the reflective cap 423 or the pixel material 415 from thermal and oxidative effects of the fabrication processes used during formation of the transparent conductive layer 419 and the pixel isolation structures 421. For example, the barrier layer 433 may be or include carbon or nitrogen containing compounds including, but not limited to, silicon carbide, silicon nitride, or silicon carbon nitride.

In some embodiments, the barrier layer 433 may be or include nitrides of titanium or tantalum, for example, when the pixel material 415 includes metals such as copper, cobalt, or aluminum. In semiconductor processing operations, such materials can be thermally stable and may not react with the pixel material 415. Other potential diffusion barrier materials for the semiconductor structure may be or include other binary nitrides including, but not limited to tantalum carbide, tungsten carbon nitride, tantalum carbon nitride, oxides of one or more of the preceding metals, silicon nitride, silicon carbon nitride, or ruthenium. In some cases, the aforementioned materials may exhibit barrier properties at layer thicknesses less than 15 nm, less than 5 nm, or less than 3 nm, or smaller, depending on one or more properties of the semiconductor operations.

The barrier layer 433 may be sacrificial, in that it may be removed during formation of the transparent conductive layer 419 and the pixel isolation structures 421. In this way, the structure 400 may include the reflective cap 423 and the pixel material 415 with negligible degradation resulting from the formation of the overlying structures. In addition, the reflective cap 423 may provide improved reflectance for the structure 400, which may improve the overall optical performance of the structure 400 as an LCoS back plane in display devices.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A semiconductor structure comprising:
   a semiconductor substrate;
   a metal layer overlying the semiconductor substrate;
   a spacer layer overlying the metal layer;
   a mirror layer overlying the spacer layer;
   an optical stack overlying the mirror layer; and
   a pixel material extending from the metal layer to the optical stack, the pixel material comprising a refractory material; and
   a reflective cap overlying the pixel material, the reflective cap having a reflective surface substantially level with an upper surface of the optical stack.

2. The semiconductor structure of claim 1, wherein the reflective cap comprises aluminum.

3. The semiconductor structure of claim 1, wherein the reflective cap is characterized by a thickness, relative to the upper surface of the reflective cap, of at least 60 nm.

4. The semiconductor structure of claim 3, wherein the reflective cap is characterized by a thickness, relative to the upper surface of the reflective cap, of less than 100 nm.

5. The semiconductor structure of claim 1, wherein the reflective cap is characterized by an aspect ratio less than 1.

6. The semiconductor structure of claim 1, further comprising a barrier layer overlying the reflective cap and the optical stack, the barrier layer comprising silicon carbon nitride.

7. The semiconductor structure of claim 1, wherein the refractory material comprises one or more of tungsten, ruthenium, or tantalum nitride.

8. A semiconductor structure comprising:
   a semiconductor substrate;
   a metal layer overlying the semiconductor substrate;
   a spacer layer overlying the metal layer;
   a mirror layer overlying the spacer layer;
   an optical stack overlying the mirror layer; and
   a pixel material extending from the metal layer to the optical stack, the pixel material comprising a non-refractory material; and
   a reflective cap overlying the pixel material, the reflective cap having a reflective surface substantially level with an upper surface of the optical stack.

9. The semiconductor structure of claim 8, wherein the reflective cap comprises aluminum.

10. The semiconductor structure of claim 8, wherein the reflective cap is characterized by a thickness, relative to the upper surface of the reflective cap, of at least 60 nm.

11. The semiconductor structure of claim 10, wherein the reflective cap is characterized by a thickness, relative to the upper surface of the reflective cap, of less than 100 nm.

12. The semiconductor structure of claim 8, wherein the reflective cap is characterized by an aspect ratio less than 1.

13. The semiconductor structure of claim 8, further comprising a barrier layer overlying the reflective cap and the optical stack, the barrier layer comprising silicon carbon nitride.

* * * * *